United States Patent [19]
Ferri et al.

[11] Patent Number: 5,953,593
[45] Date of Patent: Sep. 14, 1999

[54] METHOD AND MOLD FOR MANUFACTURING A PLASTIC PACKAGE FOR AN ELECTRONIC DEVICE HAVING A HEAT SINK

[75] Inventors: Stefano Ferri, Pioltello; Roberto Rossi, Villasanta; Renato Poinelli, Casatenovo, all of Italy

[73] Assignee: STMicroelectronics S.r.l., Agrate Brianza, Italy

[21] Appl. No.: 08/978,548

[22] Filed: Nov. 26, 1997

[30] Foreign Application Priority Data

Nov. 27, 1996 [EP] European Pat. Off. ............ 968305979

[51] Int. Cl.$^6$ ..................................................... H01L 21/44
[52] U.S. Cl. ......................... 438/122; 438/124; 257/712; 257/713
[58] Field of Search ..................................... 438/121, 122, 438/124, 126, 127; 257/712, 713, 717, 718, 719

[56] References Cited

U.S. PATENT DOCUMENTS 5,445,995  8/1995  Casati .

FOREIGN PATENT DOCUMENTS

| 0 539 095 A2 | 4/1993 | European Pat. Off. . |
| 19 44 098 | 3/1970 | Germany . |
| 04116942 | 4/1992 | Japan . |
| 06061400 | 3/1994 | Japan . |

OTHER PUBLICATIONS

Ehnert and Sukumar, "A New Surface Mount Power Package," in *Proceedings of the Annual Applied Power Electronics Conference and Exposition* (*APEC*), San Diego, Calif. Mar. 7–11, 1993, pp. 380–384.

*Primary Examiner*—Kevin M. Picardt
*Attorney, Agent, or Firm*—Seed and Berry LLP; David V. Carlson

[57] ABSTRACT

A method for forming a plastic package for a power semiconductor electronic device to be encapsulated within a plastic case and to be coupled thermally to a heat sink element having a major surface exposed and at least one peripheral portion extending outwards from at least one side of the plastic case. The method forms the plastic case of the package by molding inside a main cavity of a mold after positioning a heat sink element in a suitable housing provided in a lower portion of the mold which opens into the main cavity of the mold. The method forms the heat sink element such that at least side surfaces jutting out of said side of the plastic case are, at least in a zone adjacent to that side and in the peripheral portion, inclined to form an angle $\alpha$ substantially greater than zero with a normal line to the major surface, so as to have a negative slope from outside. The housing is formed such that its inner walls face the side surfaces of the heat sink element are inclined, at least in that zone, to form an angle substantially equal to the angle $\alpha$ with the normal line, with a positive slope from the housing interior. Thrust means engage from above with at least part of the peripheral portion of the heat sink element to exert thereon a compressive force substantially toward the housing bottom, thereby hermetically sealing the side surfaces of the heat sink element and the inner walls of the housing in the zone adjacent to said side of the plastic case during molding.

23 Claims, 6 Drawing Sheets

METHOD AND MOLD FOR MANUFACTURING A PLASTIC PACKAGE FOR AN ELECTRONIC DEVICE HAVING A HEAT SINK

TECHNICAL FIELD

This invention relates to a method for forming a plastic package for an electronic device having an heat sink exposed and which extends sideways out of the case, and a mold for use with the method.

The method of forming a plastic package for a power semiconductor electronic device to be encapsulated within a plastic case and to be coupled thermally to a heat sink element having a major surface exposed and at least one peripheral portion extending outwards from at least one side of the plastic case is of the type wherein it provide for forming the plastic case of the package be molding inside a main cavity of a mold after positioning said heat sink element with said major surface in contact with the bottom of a suitable housing provided in a lower portion of said mold which opens into said main cavity of the mold.

Reference will be made hereinafter, by way of example and not of limitation, in particular to PSO (Plastic Small Outline) packages of the dual-in-line type. More specifically we will refer to packages intended for example for automotive applications, that is for installation on device equipping motor cars.

BACKGROUND OF THE INVENTION

As is well known, semiconductor electronic devices comprise an electronic circuit formed in a small plate or "die" of a semiconductor material with a surface area dimension of a few square millimeters. Typically, the electronic circuit is integrated monolithically on a major surface of the die. The die is protected thermally and mechanically by encapsulating it within a package. Reference will be made in particular to plastic packages.

Such devices require suitable means of support and electrical interconnection for electrically connecting them to external circuits. For this purpose, a conductive lead frame, consisting of a thin wrought metal plate, comprises a plurality of narrow strips which represent electric connectors or leads each having one end connected electrically to the integrated circuit. Opposite, peripheral ends of the leads extend outwards from the package body for allowing electric interconnection of the device. On completion of the package forming process, the peripheral ends of the leads are bent and form respective pins for mounting the package, typically to a printed electronic board.

In the instance of integrated power circuits, that is, devices which typically produce a relatively large amount of heat for example due either to their high component density and/or number, or because intended for operation with large currents, reference is commonly made to so-called power packages. As used herein, the term "power package" indicates a device that can dissipate heat by some means of its own.

In a typical power package, a heat sink element or slug, supports the die and serves a heat dissipating function. The die is coupled thermally to the heat sink element to transfer outside the heat generated by the die during its operation.

The heat sink element typically is a metallic element or in any case a good heat conductor whose mass is definitely larger than that of the die or of the electronic device. It usually is in the form of a copper plate of non-negligible thickness.

In a typical realization, the semiconductor material die is mounted directly on a major surface of the heat sink element so that a surface of the die on which a circuit is formed remains free. The lead frame is attached to the heat sink element too.

Power packages are typically formed such that the heat sink element is embedded in the plastic package body, but has a major surface exposed, that is, uncovered by plastic material. The exposed major surface typically is a surface that is not contacting the die. This configuration promotes the transfer of heat from the device to the environment outside the package. To improve the dissipation of heat, this exposed major surface of the heat sink element may be in contact with an external heat sink of even larger size and mass, thereby providing enhanced heat dissipation. The external heat sink is typically formed by the structure itself to which the plastic case is soldered. Reference will be made throughout the following description and the drawings to the case in which the exposed major surface of the heat sink element is a bottom surface, that is, located on the same side as the bending of the pins. Alternatively, the top major surface of the heat sink element could be the exposed major surface, to which a suitable external heat sink may be attached.

Typically in a power package, the heat sink element has only one major surface exposed, the other major surface and all the side surfaces being insulated, that is covered with the plastic material of the case. Throughout the following description, side surfaces are those surfaces of the heat sink element which connect perimetrically the two major surfaces substantially parallel to each other.

Shown schematically in FIG. 1 is a package having an exposed heat sink element as it appears immediately after forming the plastic case. The package is shown in a side view taken parallel to the direction of the leads, and partly in section in the left-hand portion of the figure. The cross-section is the obliquely hatched area. The package is generally denoted by 1 in that figure.

FIG. 1 and the following figures illustrate by way of example a package of the DIP (Dual-In line Package) type, that is one having its leads projecting out from two opposite sides of the package body.

For clarity and simplicity of illustration, the semiconductor material die has been omitted from the sectional view.

A plastic case, shown at 2, has a heat sink element 3 embedded therein such that only the bottom major surface 4 thereof, at the same level as the case bottom surface, will be exposed. A leadframe 5 is connected to the heat sink element 3 at the opposite side from the surface 4 by connecting means such as rivets or weldings, not shown in the sectional view. The leadframe 5 is partly enclosed in the case 2, so that ends of its lead, denoted by 6, extend outside of the case 2, to the left and right in FIG. 1. Shown outside the case 2, getting out of the plane determined by the case side surface in view, is a support structure 7 of the leadframe interconnecting a number of leadframes, as explained hereinafter.

For a better understanding of aspects of the present invention the usual steps of a process for forming a conventional package with exposed heat sink will now be described briefly.

Each heat sink element is obtained by shearing from a relatively thick sheet of metal, e.g., copper. From a thinner sheet, also typically of copper, a bearing structure is formed in the form of a strip and a series of leadframes, each including an assembly of narrow metal strips which are interconnected by transverse connecting lines and are intended to become the leads. To the bearing structure at each leadframe is connected a corresponding number of heat sink elements.

A corresponding number of dies are mounted integrally to this formed structure, such that each die locates at one leadframe/heat sink element structure. As mentioned above and described, for example, in European Patent Application 545007 of this Applicant, each die is connected, according to a standard technique, directly to the heat sink element without the leadframe interposed therebetween. The die is positioned in the central region of the heat sink element, isolated from the leads. Reference will be made in the following description to this case wherein the leadframe has no dedicated area for accommodating the die. In this instance, the die is connected to the heat sink element either by soldering with an alloy such as tin/lead or by gluing with for example an epoxy glue. Alternatively, another solution provides for the die being accommodated on a central portion of the corresponding leadframe, which is also connected to the heat sink element. Thin wires, usually of gold or aluminum, are bonded with one end to dedicated metallized pads provided on the die surface where the integrated circuit is formed, and with the other end to the inward ends of the leads.

Subsequently, the strip with the dies mounted thereon is placed into a mold having cavities corresponding to the single devices for forming their corresponding plastic cases. Injected into each cavity is an electrically insulative material, in the molten state at a high temperature, which is to form the plastic body of the package. This material is typically a synthetic resin, e.g., an epoxy resin.

Molding in the proper sense comprises the injection of the resin into the cavities. However, the molding process comprises several phases whereat the temperature is varied gradually to avoid cracking the semiconductor material that forms the die, or otherwise making the overall device unreliable. The term molding is used herein to denote all the operations carried out inside the mold cavity: melting the plastic material, letting it expand into the cavity, and allowing it to solidify.

After an initial cooling step, and subsequent resin thermal curing steps to achieve thorough polymerization, the plastic cases will be completely formed, and the series of packages ready for removal from the mold.

FIG. 2 shows schematically a mold at a stage immediately preceding the molding step to form the package shown in the previous figure. The figure shows in particular a single mold cavity.

A mold for the injection of resin is generally shown at 8. It comprises, in the common embodiment shown in the figure, an upper half-shell or top mold designated 8a, and a lower half-shell or bottom mold 8b. Both half molds have a corresponding hollow, and when the mold is closed, are arranged with their hollows facing each other to provide a single mold cavity whereinto the resin can be injected.

The molten resin is injected through a gate type of inlet, designated 9 in FIG. 2, formed in the mold, specifically in the bottom mold 8b, which has one end open into the mold cavity. The gate inlet 9 has a substantially horizontal main axis. Its location is in any case such that the cavity can be filled even in its region at the extreme right in the figure, farthest from the resin entrance.

The structure that includes the heat sink element 3 and the leadframe 5 has been introduced for molding into the mold cavity, according to the configuration shown in FIG. 2. Also shown in FIG. 2 is a die of a semiconductor material 10 fixed to the center of the top surface of the heat sink element 3 opposite from the major surface 4 to be left exposed.

As can be seen, the leadframe 5 is located at the same level as the interface between the two half molds, and is positioned such that the terminating portions of the leads 6 are left outside the mold cavity. Thus, for forming such a package, the mold 8 typically has one closure level only, when viewed in vertical cross-section, consisting of the surfaces at the interface of the two half molds and corresponding to the level of the leadframe 5. The presence of such a closure level is effective to make possible the introduction of the leadframe into the cavity in a easy way while allowing its outermost portions to remain outside.

The heat sink element is located on the bottom of the mold cavity formed in the bottom mold 8b such that the bottom surface 4 will not be covered by the resin. On the other hand the mold cavity has larger side dimensions than the heat sink element 5, and will therefore fully enclose it so as to keep the heat sink element 5 isolated laterally all around its perimeter.

Both the bottom and top portions of the mold cavity have substantially the shape of a parallelepiped. Accordingly, the cavity shape for molding that type of package is particularly simple.

However, for certain applications, the power package has a different structure from that shown. For several necessities, the heat sink element, additionally to having a major surface exposed, will be partially extended laterally out of the plastic case, from at least one of its sides. For example, the heat sink element has two peripheral portions projecting from two opposed sides of the plastic case.

Thus, such packages also have exposed part of the other major surface and of the side surfaces of the heat sink element at such peripheral portions. This description will make reference to this type of package.

FIG. 3 is a perspective view of a known embodiment of a power package with the heat sink partially extended out of the plastic case. Reference will be made herein, by way of example, to a package known as Plastic Small Outline (PSO), of the type typically employed for automotive applications.

The package is overall denoted by the reference numeral 11 and shown at the end of its manufacture, after bending the pins, ready to be soldered to an external electric circuit.

As shown in the figure, the plastic case 2 partly encapsulates a heat sink element, generally denoted by 12 here, which, besides having its bottom surface exposed, extends sidewards out of the plastic case 2 in the direction denoted by y. On the contrary in the orthogonal x direction, the dimensions of the plastic case 2 exceed those of the corresponding sides of the heat sink element 12.

In particular, the heat sink element 12 has in this example two peripheral portions, designated 13 in FIG. 3, which symmetrically extend outwards. In these portions 13, the top major surface 14, the side surface 15 lying in the x direction, and part of the side surfaces 16 parallel to the direction determined by the axis y are also exposed.

The profile of the plastic case 2 and of the heat sink element 12 are determined by the particular conformation of the specific example.

The leads, bent over to form the pins 17, are extended outside the plastic case 2 of the package 11 from opposite sides in the x direction, orthogonally to the direction along which the heat sink element 12 extends beyond the case 2.

For forming the plastic case of a package of this type, a mold must be used which has a more complex molding cavity than that shown in the previous FIG. 2.

The term main cavity will be used in the following description to indicate that portion of the mold cavity which has the shape of the plastic case envelope without taking into account the presence of the heat sink element therein. Thus, it will commonly have a substantially parallelpipedic shape. The main mold cavity, such as the mold cavity used in the example shown in FIG. 2, typically results from the combination of an upper hollow formed in the top mold and a lower recess provided in the corresponding half-shell.

In this case, however, the dimension of the main mold cavity along the y direction must be shorter than the length along y of the heat sink element 12. Thus, it will be necessary for the mold considered overall to comprise a specific seat for the heat sink element, and in particular to provide a housing for the heat sink element which extends in the y direction outside the main mold cavity, and which is furthermore connected to the main mold cavity such that the plastic case can be formed around the heat sink element in the x direction. This housing is a blind hole, i.e., without side outlets, formed in the bottom portion of the mold.

The molding technique provides for the mold to have for this purpose, additionally to a conventional first closure level corresponding to the leadframe, as in the simpler case previously discussed, a second closure level at the top major surface of the heat sink element. The aforementioned housing is provided at least below this level.

Such a configuration may typically cause some drawbacks during the molding step. Specifically, problems may be encountered at the interface between the housing portions which are intended to receive the portion of the heat sink element outside the plastic case, and the main mold cavity. In fact, at the second closure level the mold sealing during the molding is specially critical. Particularly between the surfaces of the heat sink element, which must be left exposed, and said housing formed in the mold, hermeticity is very difficult to achieve. Thus, during the molding step, the molten resin may partly leak out of the mold cavity in the y direction towards the most peripheral portions of the heat sink element. Over the related surfaces of the heat sink element, the leaking resin may result in the formation of flash, that is thin layers of plastic material which solidify on the external surfaces of the heat sink element.

To illustrate this problem, FIG. 4 shows a schematical top view of the lower portion of a mold during the molding of the package shown in the previous figure. Both the leadframe and the semiconductor material die have been omitted, and only the heat sink element 12 of the semiconductor structure is shown, for clarity reasons.

The lower portion of the mold main cavity, denoted by 18, extends in the x direction sideways of the heat sink element 12 in connection with its central portion. The heat sink element 12 is disposed to have its peripheral portions 13 at the ends of a housing 19, which is formed in the mold lower portion and extends substantially in the y direction beyond the mold main cavity 18. The upper closure of the housing 19 is determined by the upper structure of the mold, not shown in FIG. 4.

FIG. 4a is an enlarged detail view of the portion enclosed within a broken line circle in FIG. 4.

As can be seen, it is impossible to arrange for perfect adhesion of the portions of the side surfaces 16 of the heat sink element that are to stay out of the case to the walls of the housing 19. To indeed ensure proper positioning of the heat sink element 12 in the housing 19 with no cracking risk, the latter is formed with its width along x in the portions 13 slightly smaller than that of the cavity which forms the housing. Thus, a passage channel on the order of a few microns is left at each of the portions 13. An arrow indicates in FIG. 4a a flow direction of a resin leak from the mold main cavity toward the housing 19. Upon solidification of the resin, thin resin layers or flashes will form on the surfaces of the portion 13.

For the device to operate properly, an additional step must be provided after molding to remove the resin flashes. However, those resin flashes are very difficult to remove because of their positions.

On the other hand known are molds whose inner shape presents into the cavity elements which push a metal slug against the bottom of the housing where it is placed, so as to improve the adhesion of the heat sink element to the mold. However, not even this configuration is appropriate to prevent resin formations on the exposed side surfaces of the heat sink element, although it ensures good adhesion of the housing bottom to the bottom surface of the heat sink element.

A known solution to this problem provides for the use of blocking bars formed in the structure of the heat sink element at the peripheral portions thereof. To this aim, the heat sink element/leadframe structure is formed integrally from a thick metal sheet, by shaping the heat sink element and then reducing the thickness at the sides and forming by shearing the leadframe.

A structure of this type is shown in FIG. 5. The heavy outlined portion is the heat sink element 12, lighter lines being used to draw the leadframe 5. As shown in the figure, the leadframe 5 and heat sink element 12 form a monocomponent and are joined to each other by blocking bars 20. These bars 20 of copper consist of side extensions of the peripheral portions 13 of the heat sink element 12 in the x direction. When the structure of FIG. 5 is placed into the mold, the bars 20 substantially close the side channel for the resin flow indicated in FIG. 4a.

On completion of the molding step the bars 20 must be removed to separate the heat sink element 12 along the broken lines in the figure. However, this additional operation renders the process critical because cracks may occur at the side extensions due to inaccuracies of the parting apparatus, which requires appropriate calibration.

A further drawback of the known solution of FIG. 5 is related to the formation of the mono-component heat sink/leadframe structure. The leadframe thickness cannot be less than a minimum value, if it is not to be distorted during its formation due to the weight of the heat sink element whose mass is far greater.

In addition, with this known solution, the mold must be given quite a complex configuration in order to accommodate the mono-component structure.

While reliability and repeatability of a package thus formed can be improved, still the formation of resin flashes cannot be prevented altogether.

A further known solution is disclosed in U.S. Pat. No. 5,445,995 to the assignee of the present invention. The mold is modified there to allow the resin to flow freely further outwards the peripheral portions of the heat sink element along a y direction into suitable alveoli.

FIG. 6 shows schematically a vertical cross-section along the y direction through a mold made in accordance with that patent. Thrust elements 21 compress the heat sink element against the bottom of its housing. As shown, alveoli 22 outside the heat sink element are filled with resin through suitable channels, not shown. The width of each alveolus 22 in the x direction is the same as that of the portions of the heat sink element which are to be left outside the plastic case.

The plastic tips thus formed within the alveoli 22 must then be removed, after taking the case out of the mold. This additional operation is critical especially with configurations like that shown in FIG. 3 by way of example, wherein the peripheral portions of the heat sink element have the same width as the heat sink element, and substantially of the same order as the plastic case. In this instance, the plastic case may be cracked during that step.

Thus, it is impossible to form a package which will be free from resin residues on the exposed surfaces of the heat sink element, without this being accompanied by drawbacks.

The underlying problem of this invention is to provide a method whereby can be formed, by only the molding process without the need of additional steps, a plastic package with an heat sink exposed and having portions extending peripherally from the plastic case kept free from resin leakouts.

Furthermore the mold used and the conformation of the heat sink element/leadframe structure should be particularly simple.

SUMMARY OF THE INVENTION

According to principles of the present invention, it is possible to ensure, during the molding process, the hermeticity between the side surfaces of the heat sink element to be left outside the plastic case and the corresponding walls of the housing formed in the lower portion of the mold, while ensuring proper positioning of the heat sink element in its housing, by using a housing with inclined walls and by shaping the side surfaces of the heat sink element to match this inclination at least in the zone nearest the plastic case.

A method according to this invention provides for the formation of a plastic package for a power semiconductor electronic device with a partially exposed heat sink. The semiconductor electronic device is fully encapsulated within a plastic case and coupled thermally to a heat sink element. The latter has an exposed major surface and at least one peripheral portion extended outside the plastic case from at least one of its sides. The plastic case is formed by molding in a main cavity of a mold. The heat sink element has first been placed into a suitable housing provided in a lower portion of the mold, such that the major surface to be left exposed contacts the housing bottom. This housing also opens into the main cavity of the mold.

According to an embodiment of this invention a method includes the following steps:

forming said heat sink element such that at least side surfaces jutting out of said side of the plastic case are, at least in a zone adjacent to said side and in said peripheral portion, inclined to form an angle substantially greater than zero with a normal line to said major surface, so as to have a negative slope from outside;

correspondingly forming said housing such that its inner walls facing said side surfaces of the heat sink element are inclined, at least in said zone, to form an angle substantially equal to said angle with said normal line, with a positive slope from the housing interior; and providing thrust means which, when the mold is closed, is engaged from above with at least part of said peripheral portion of the heat sink element to exert thereon a compressive force having its direction substantially toward the housing bottom and which is effective to hermetically seal temporarily in said zone adjacent to said side of the plastic case said side surfaces of the heat sink element and said inner walls of the housing.

Advantageously, when the mold is closed, the inclined side surfaces of the heat sink element, in its peripheral portion to be left outside the plastic case, are therefore pressed by the thrust means toward corresponding inclined walls of the housing. In fact, by having both such side surfaces and such walls inclined, the compressive force exerted by said thrust means in a downward direction will have a component orthogonal to such surfaces. Thus, perfect temporary relative adhesion is ensured during the molding process of the side surfaces of the heat sink element to the walls of the housing in which it is located at least in the nearest zone to the mold main cavity, that is to the side of the plastic case whence the heat sink element extends. Accordingly, the hermeticity of the closure clamping of the mold is ensured even at the aforementioned second closure level by the method of this invention. In this way, bothersome leakouts of plastic material from the mold main cavity toward the peripheral portions of the heat sink element can be prevented.

Preferably, according to this invention, the housing for the heat sink element includes a suitable portion of a through-going groove formed in the lower portion of the mold. According to this invention, it is indeed unnecessary to provide a blind hole for accommodating the heat sink element because the thrust elements together with the heat sink element will act as a barrier or side closure of the mold in the direction along which the heat sink element extends out of the case. The mold is, therefore, simpler to manufacture.

Furthermore, each heat sink element is positioned with its central portion, to be left inside the plastic case, corresponding to widenings of the groove which will form the lower portion of the mold main cavity. The peripheral portion of the heat sink element to be left outside the plastic case is properly inserted into the groove outside said widenings. Advantageously, the depths of the groove and the cavity are substantially equivalent, such that the rims of the recesses formed thereby are at the same level. In this way the lower portion of the mold can be formed by digging from the surface of the bottom mold to form both the groove and the lower portion of the cavity.

In a preferred embodiment, the groove is straight and has inner side surfaces inclined through the entire groove length and has a plurality of widenings for accommodating a given number of heat sink elements positioned parallel and spaced apart from one another in the groove. The heat sink elements may be inclined throughout the portion to be left outside the case those external side surfaces substantially orthogonal to the sides of the case whence they come out.

In addition, a package for a power semiconductor electronic device comprises a plastic case to be formed by a molding process wherein at least one die of a semiconductor material is completely encapsulated which has an electronic circuit formed therein and is coupled thermally to a heat sink element having an exposed major surface and at least one peripheral portion extended out of the plastic case from at least one side thereof. According to this invention, at least side surfaces of said heat sink element extending out from said side of the plastic case form, at least in a zone adjacent to the case and in said peripheral portion, an angle substantially greater than zero with the direction of a normal line to said major surface of the heat sink element having a negative slope from outside.

The features and advantages of the method according to this invention will be apparent from the following description of an embodiment thereof, given by way of example and not of limitation with reference to the accompanying drawings.

DETAILED DESCRIPTION OF THE INVENTION

Figure 7:
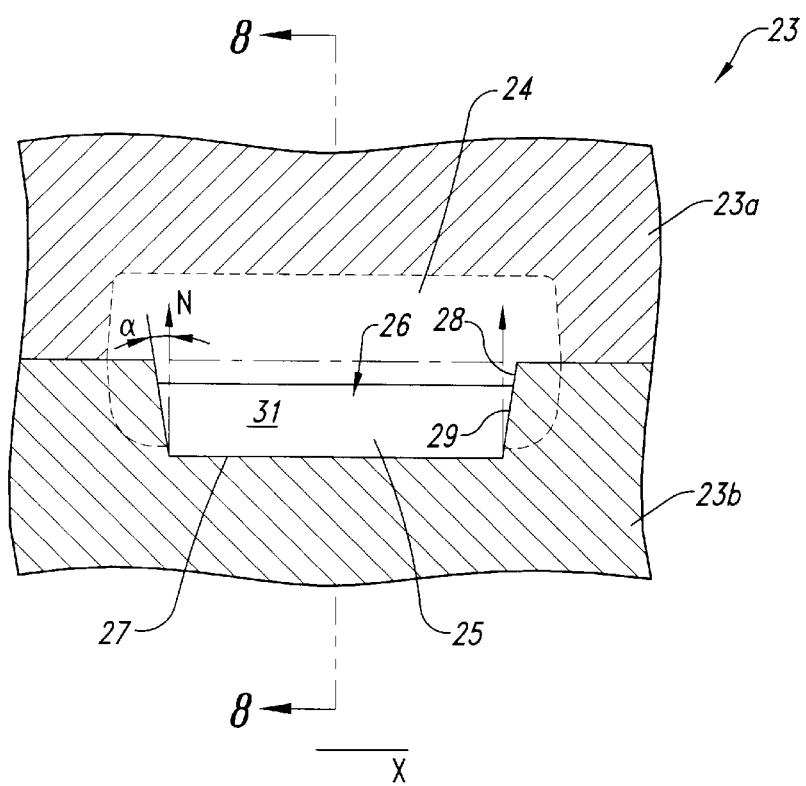
FIG. 7 is a sectional view of a mold and plastic semiconductor package according to the present invention.
Figure 8:
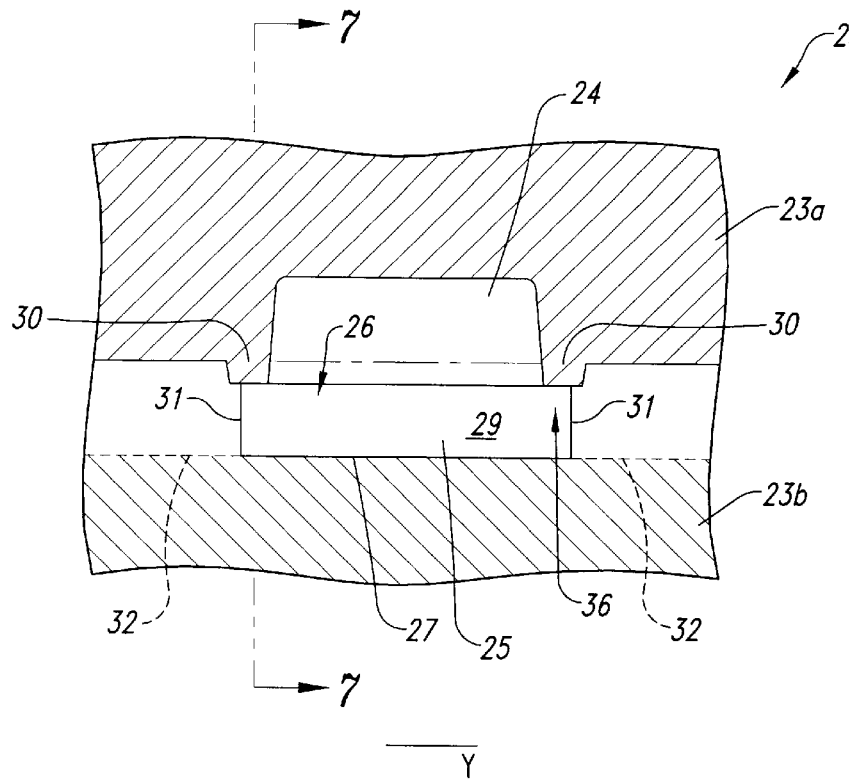
FIG. 8 is a sectional view of the mold and package taken along line A—A of FIG. 7.

Referring to FIGS. 7 and 8, a scheme is shown which is illustrative of a method according to this invention and is visible an apparatus for forming a plastic package with a heat sink partially extended out of the case.

The figures are vertical cross-section views of a mold, generally and schematically shown at 23, which embodies the principles of this invention. The cross-sections have been taken along directions, respectively orthogonal and parallel to the direction in which the heat sink element is extended out of the plastic case, as indicated by lines B—B and A—A, respectively, in FIG. 8 and FIG. 7. In particular, referring to the preceding figures, FIGS. 7 and 8 are parallel to the directions designated x and y, respectively.

FIGS. 7 and 8 show a single mold cavity for forming a single package, although the mold typically includes a plurality of cavities.

The mold 23 comprises an upper half-shell or top mold 23a and a lower half-shell or bottom mold 23b. In both of FIGS. 7 and 8, the mold is shown closed with the two half molds facing each other, as it appears typically during the molding step.

An upper hollow and lower hollow formed in the two half molds 23a and 23b define, when the mold is closed, a mold main cavity 24 for forming the plastic case of the package. In the figures, the two portions of the mold main cavity are marked off by an imaginary broken line between the two half molds.

Only the heat sink element, as indicated at 25, has been drawn inside the mold with the other parts needed to form the package omitted for simplicity because conventional in both construction and position.

The heat sink element 25 is placed in a suitable housing, overall indicated at 26, which is formed in the lower portion of the mold 23, specifically in the bottom mold 23b. The bottom major surface 27 of the heat sink element is in contact with the bottom surface of the housing 26. The latter opens into the mold main cavity 24 from which it is extended outwards in the y direction, as shown in FIG. 8.

In this schematical representation, the heat sink element extends, by way of example only, out from two opposite sides of the mold main cavity and in a substantially symmetrical arrangement. However, it could be a different configuration, still remaining within the invention scope.

In accordance with this invention and as shown in FIG. 7, sidewalls 28 of the housing 26 are parallel to the y direction, that is the direction in which the heat sink element is to extended out of the plastic case, and are inclined from the vertical direction, unlike conventional cases. In other words, the sidewalls 28 form an angle $\alpha$ with a normal direction, determined by the half lines N, to the major surfaces of the heat sink element 25, and specifically to the surface 27 or to the bottom of the housing, so as to have a positive slope from the housing interior. Shown at 29 in FIGS. 7 and 8 are side surfaces 29 of the heat sink element 25 which are parallel to the y direction, to be partially enclosed within the plastic case. Correspondingly to the slope of the inner walls 28 of the housing, the portions of the side surfaces 29 of the heat sink element which are to be left outside the plastic case and facing said housing walls 28 are inclined, forming an angle substantially equal to $\alpha$ with the N direction.

In FIG. 7, the side surfaces 29 of the heat sink element and the walls 28 of the housing 26 have been drawn coincident for simplicity. However, as previously described in connection with the known solution, for proper positioning of the heat sink element 25 within its housing 26 a minimal gap on the order of a few microns should be allowed between the two surfaces.

Prior to molding, the heat sink element should be positioned without being fixed in its housing to avoid mold wear problems and damaging the device during its removal from the mold at the end of the molding step.

The heat sink element 25 is pushed down into the mold and caused to adhere on the inner walls in accordance with this invention during the mold closing.

When the mold is closed, thrust means 30 will engage from above with at least a part of peripheral portions 36 of the heat sink element 25 external to the mold main cavity 24 and contained within the housing 26. Preferably, such thrust means includes, as shown schematically in FIG. 8, elements (protrusions) 30 jutting out of the top mold 23a and extending downwards at the side of the recess of the top mold 23a, and hence of the main mold cavity 24, and being adjacent thereto. The protrusions 30 exert a compressive force substantially downward on the peripheral portions 36 of the heat sink element 25. The heat sink element 25, being made typically from a deformable material such as copper, undergoes a slight deformation at these portions.

In particular, the overall effect is that of sealing. This compressive force according to this invention also applies a pressure to the side surfaces 29 of the heat sink element 25 by forcing the entire heat sink element downward. Said force has, in fact, a non-zero component orthogonal to the latter because the direction of the force also forms an angle α with the surfaces 29. The latter are pressed at these portions against the corresponding inner walls 27 of the housing which are parallel to them. The strength of the compressive force exerted by the protrusions 30 is selected to cause the surfaces 29 to adhere to the walls 28.

Perfect adhesion is ensured in this way during the molding step, between the side surfaces of the heat sink element outside the plastic case and the facing walls of the housing, that is in the most critical region as regards hermeticity. Thus, leakouts of plastic material from the mold main cavity onto the surfaces of the heat sink element inside the housing are prevented.

The barrier to the outflow of resin from the mold main cavity is provided by the combined actions of the protrusions down-pressing and of the heat sink element acting as a plug.

It should be considered that according to this embodiment of the invention that such actions should be exerted near the zones where the side surfaces of the heat sink element extend out of the plastic case, that is close to the mold main cavity. It is in such regions that the housing walls and corresponding side surfaces have to be inclined. On the other hand the shape of the housing outside such zones is not among the main objectives of the present invention.

In accordance with this invention, the reliability of the resulting case is then ensured. Therefore during the package forming process no particularly complex and following steps of removing residual resin are needed. The process is, therefore, particularly simple, and the overall device packaging time is advantageously shortened.

On the other hand no steps additional to the molding are intrinsically contemplated, like removing metal or plastic parts as is done in the known processes previously described, because the mold is already adapted to obtain the package in its finished form. This avoids the need for dedicated equipments sometimes expensive. Furthermore, the plastic case integrity is guarded by keeping it away from the risk of cracking or suffering any damage during such additional steps.

According to this invention, the angle α is selected illustratively to avoid difficulties in manufacturing the mold and heat sink element; it may be selected to be typically greater than 1° and smaller than 30°. An angle in the range of 12–20° is preferred according to one embodiment of the invention.

The side surfaces 31 of the heat sink element 25, as shown in FIGS. 7 and 8, lie orthogonal to the surfaces 29, that is along the x direction, completely outside the plastic case. The side surfaces 31 could remain conventionally vertical for the purposes of this invention. In other words, they form a substantially zero angle with the straight line N. In this way, the manufacture of the heat sink element is advantageously simplified.

Notice that by having the walls 28 of the housing inclined similarly to the surfaces 29 of the heat sink element, the housing 26 can be advantageously utilized as a guide in positioning the heat sink element 25 inside it. This can be seen as a self-aligning feature in the x direction since the heat sink element 25, if placed twisted by mistake, would automatically turn and regain its correct position. Due to this problem, prior processes required manual intervention or at least additional checking of the heat sink element for placing it in a proper position.

Thus, the invention allows automatic machines of the pick-and-place type to be used which would pick and position heat sink elements without any further checking.

Notice that according to this invention the housing for the heat sink element need not be delimited in the y direction; this because of the apparatus configuration ensuring perfect closing of the mold cavities even in this direction. In FIG. 8, the two horizontal broken lines indicated at 32, at the level of the bottom surface 27 of the heat sink element 25, denote that the housing structure may be extended beyond the length of the heat sink element in the y direction along which it extends out of the mold main cavity.

Figure 9:
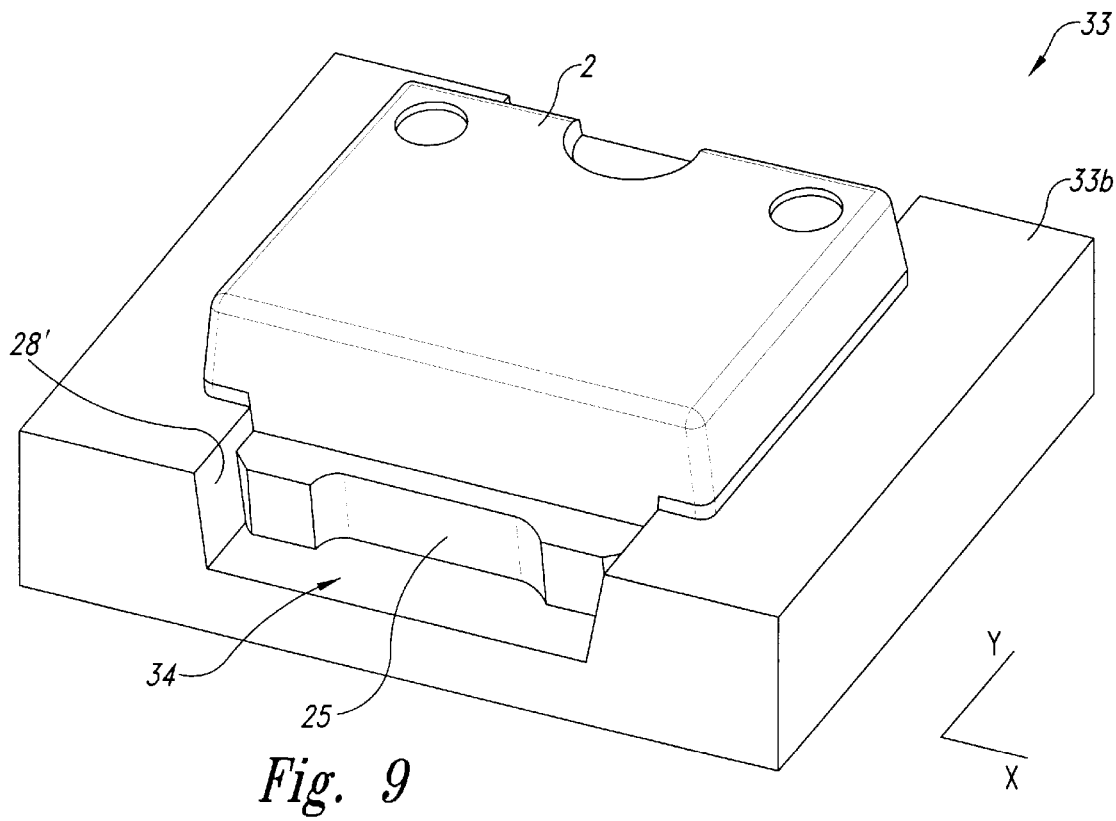
FIG. 9 is a perspective view of the plastic package and the lower portion of a mold open at the end of the molding step, according to one embodiment of this invention.
Figure 10:
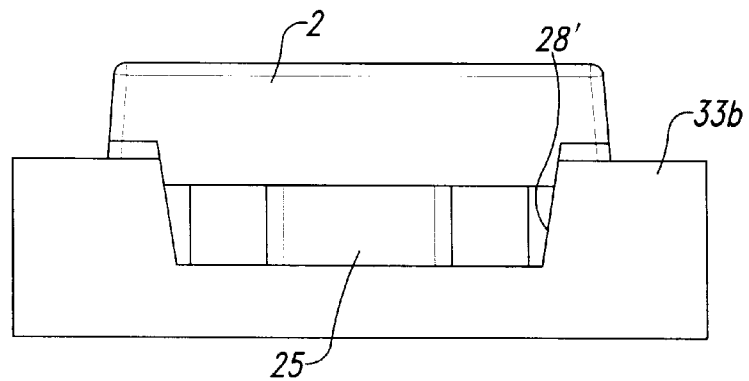
FIG. 10 is a side elevational view of the mold and package shown in FIG. 9.

In this sense, a preferential embodiment of this invention is shown in FIGS. 9 and 10. In these figures, the same reference numerals as in the previous figures have been retained to denote equal or similarly functioning parts and elements.

Figure 1:
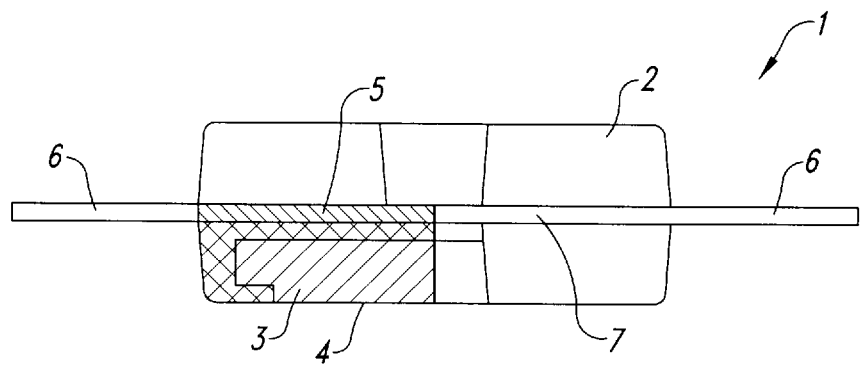
FIG. 1 is a side view showing schematically a plastic package with exposed heat sink of a known type, which does not extend sidewards out of the plastic case.
Figure 2:
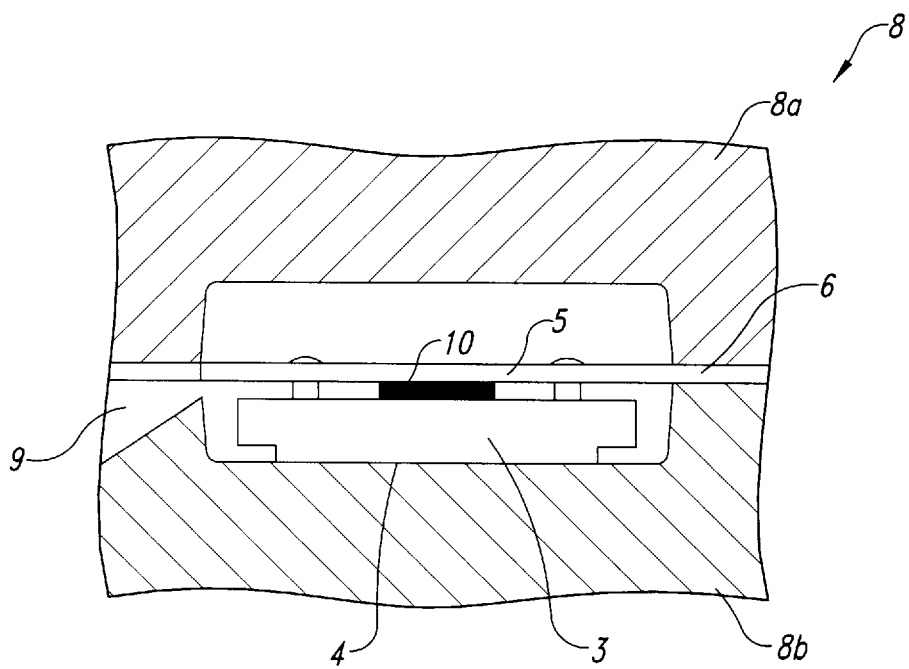
FIG. 2 illustrates the step of molding the package shown in the preceding figure.
Figure 3:
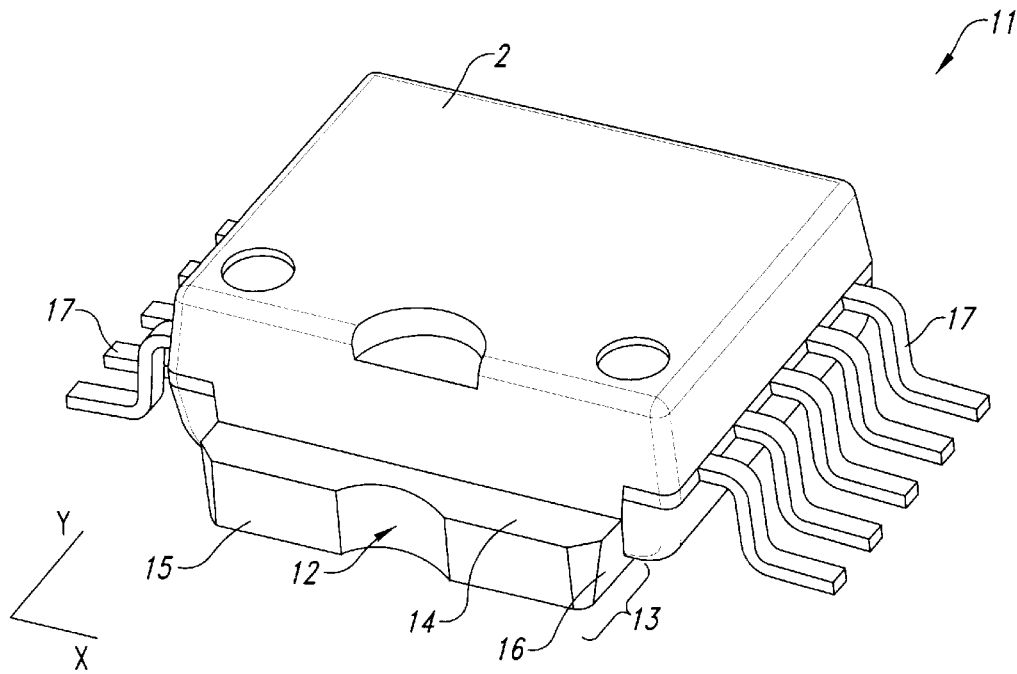
FIG. 3 is a perspective view of a plastic package of a known type having a heat sink element partially extended peripherally out of the plastic case.
Figure 4:
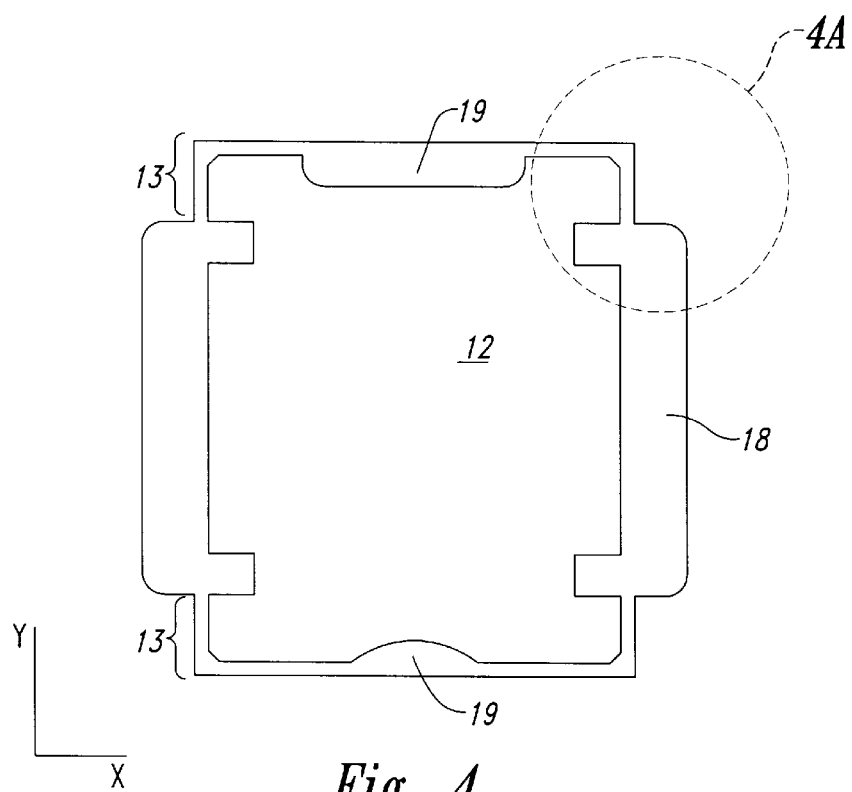
FIG. 4 is a plan view showing the molding step according to a conventional technique for forming the package of FIG. 3.
Figure 4A:
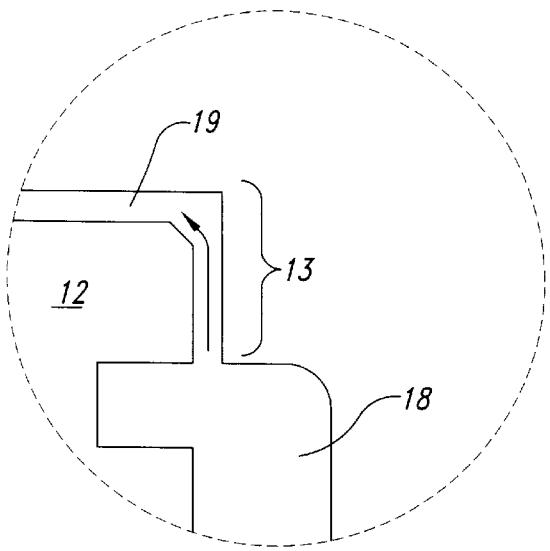
FIG. 4a is an enlarged view of the package of FIG. 3, highlighting a drawback of the technique shown in FIG. 4.
Figure 5:
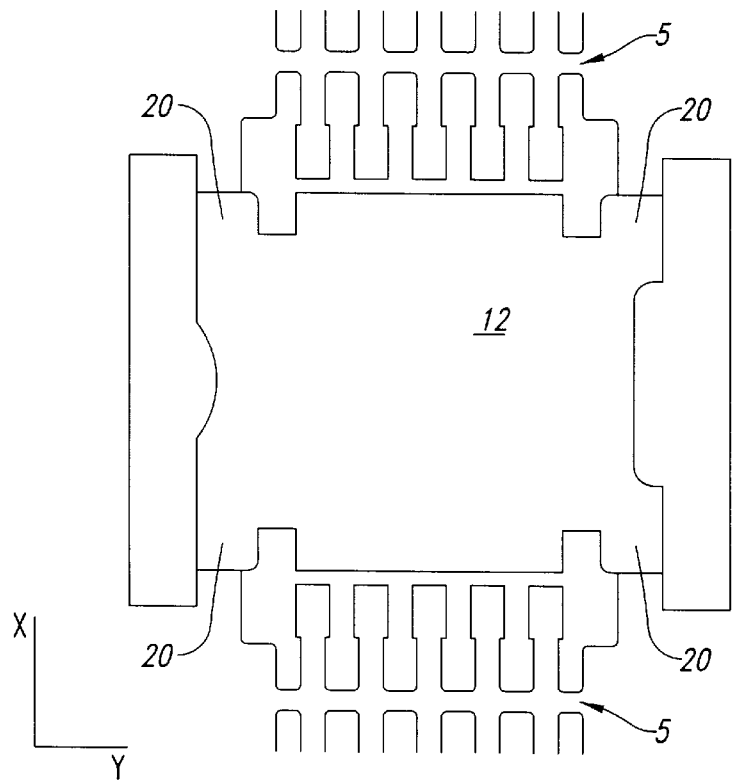
FIG. 5 shows a leadframe/heat sink element structure according to a first known embodiment for obviating the illustrated drawback.
Figure 6:
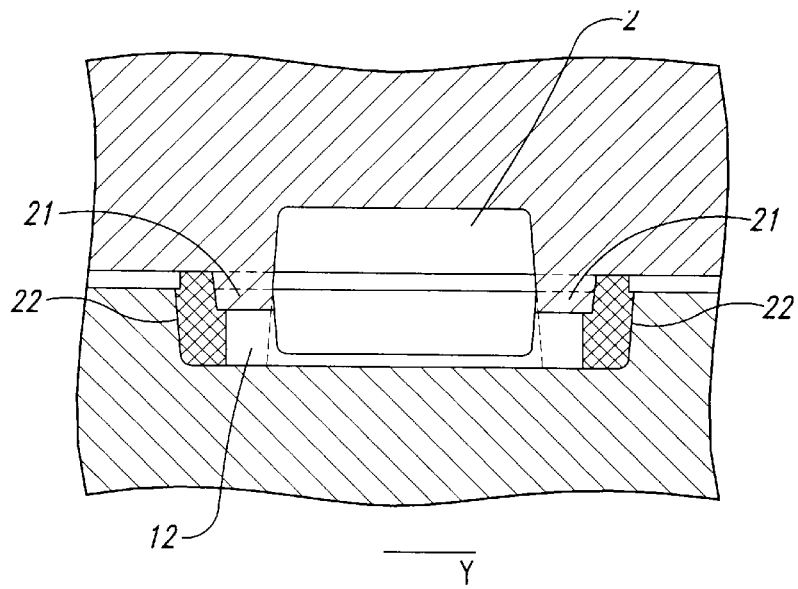
FIG. 6 illustrates a method for forming a package with a heat sink partially extended out of the plastic case, according to a second known solution.

In this example, reference is made in particular to a method for forming a PSO type of package, such as that illustrated in connection with the prior art of FIG. 3. The package is of the dual-in-line type, with electric interconnecting pins coming out of the package from two opposed sides and orthogonally to the direction in which the heat sink element is extended out of the plastic case.

FIG. 9 shows a perspective view of a mold open at the end of the molding operation for the plastic case of the package. In particular, the mold is shown referring to a single device. FIG. 10 shows a side elevation view of the mold and plastic case taken in the orthogonal direction to that of outward extension of the heat sink element 25.

The mold is overall shown at 33, and in both figures only its lower portion 33b is in view. On its interior, the plastic case 2 is partially inserted into the lower portion of the mold main cavity and projects upwardly from the bottom mold 33b.

Being omitted for simplicity is the leadframe which locates at the level of the upper surface of the top mold 33b having, in this example, connecting leads which are partially extended outside the plastic case in the x direction, from both sides.

According to this preferential embodiment of the invention, to accommodate the heat sink element 25, a groove 34 is provided in the bottom mold 33b which goes through the bottom mold 33b from one side to other. The groove 34 has a main axis along the direction in which the heat sink element 25 is to extend out of the plastic case 2, i.e., parallel to the y direction. The width of the groove 34 is equal to the dimension along x of the heat sink element 25.

The walls of the groove 34 parallel to the y direction, indicated at 28' in these figures, are inclined, according to this invention, at an angle α from the normal N. In a preferential embodiment, an angle a around the 15° range was selected.

The depth of the groove 34 is such that its bottom locates correspondingly to the bottom surface of the package. Its edge is at the level of the leadframe, that is of the separation line between the two half molds, so that the leads can be left outside the mold cavity. Essentially, its depth is the same as that of the lower main mold cavity. The heat sink element 25, which in the package commonly has its top surface at a lower level than the leadframe, is fully contained within the groove 34, its height being smaller than the groove depth.

The lower portion of the mold main cavity forms a enlargement in the x direction of the groove 34 at the location where the heat sink element 25 is to be placed. In particular, the heat sink element is disposed such that its central portion, to be encapsulated within the plastic case, is in correspondence with said enlargement, and with its peripheral portions within the groove 34 but outside the enlargement.

The side surfaces 28' of the heat sink element are correspondingly inclined at least inside the groove in the portions outside the plastic case, and in contact with the groove walls. On the other hand it is unnecessary for the central portions of the side surfaces of the heat sink element to be similarly arranged, since they are engaged in the groove, without contacting any walls, being faced the enlargement formed by the lower mold cavity. In a preferential embodiment, these central portions are not inclined but are orthogonal to the bottom major surface 27 of the heat sink element.

Notice that the peripheral surfaces of the plastic case, and correspondingly therewith the inner walls, not visible, of the mold cavity, are inclined as in the conventional structure for easy removal from the mold, independently of the objects of this invention.

In the preferential embodiment, the through-going groove can accommodate a given number of heat sink elements, typically some tens of them, placed parallel. In a practical embodiment, the groove 34 could contain about fifteen heat sink elements, and the bottom mold 33b was formed with several parallel through-going trenches.

Thus, in its preferential embodiment, each groove 34 is formed from one side to another into a main surface of the bottom mold. It has the appearance of a hollow with inclined walls, having a single main axis and presenting a corresponding number of widenings, also parallel to one another and spaced apart at the locations where the heat sink elements 25 will be placed.

The heat sink elements are typically placed into the groove simultaneously, after riveting them to a single metal strip which includes their respective lead frames. However, the heat sink elements could be placed into the groove sequentially, for a different process wherein the heat sinks are attached to the leadframes after being placed into the mold.

Notice that the heat sink element 25 can be placed into the mold 33b in a particularly easy manner, in this preferential embodiment wherein the housing for the heat sink element is other than a blind hole. The groove represents a straight guide having possible the placement of each heat sink element may be laid in place by inserting it laterally of the mold through one of the two side mouths of the groove.

The protrusions 30 are formed on the upper portion 33b of the mold, not shown in the figures, of the groove, and fit into the groove 34 upon closing the mold, to engage the peripheral portions 36 of the heat sink element 25 which lie outside the main cavity. It is on this account that the protrusions 30 are formed laterally of the upper portion of the mold main cavity. Their width is substantially the same as that of the groove. For each mold cavity, a pair of protrusions are typically provided on opposing sides such that, between adjacent cavities, there will be two limited protrusions in the y direction. In an alternative embodiment, two protrusions of two adjacent cavities may be joined into a single, extended protrusion between the two adjacent cavities, adapted to be inserted inside the groove. Their height is such that their tips, with the mold closed, will not reach the bottom, but stop at the same level as the upper major surface of the underlying heat sink element.

The mold structure, and in particular that of its lower portion, is therefore particularly simple according to the preferential embodiment of this invention. Advantageously, this affords lower manufacturing costs than conventional molds. In the known solutions, in fact, the mold needed to have a more complicated structure. Nowhere could an "open" configuration like that of our preferential embodiment with a through-going groove be used, since it was necessary to define a delimited area in the bottom mold for containing the plastic material.

Figure 11:
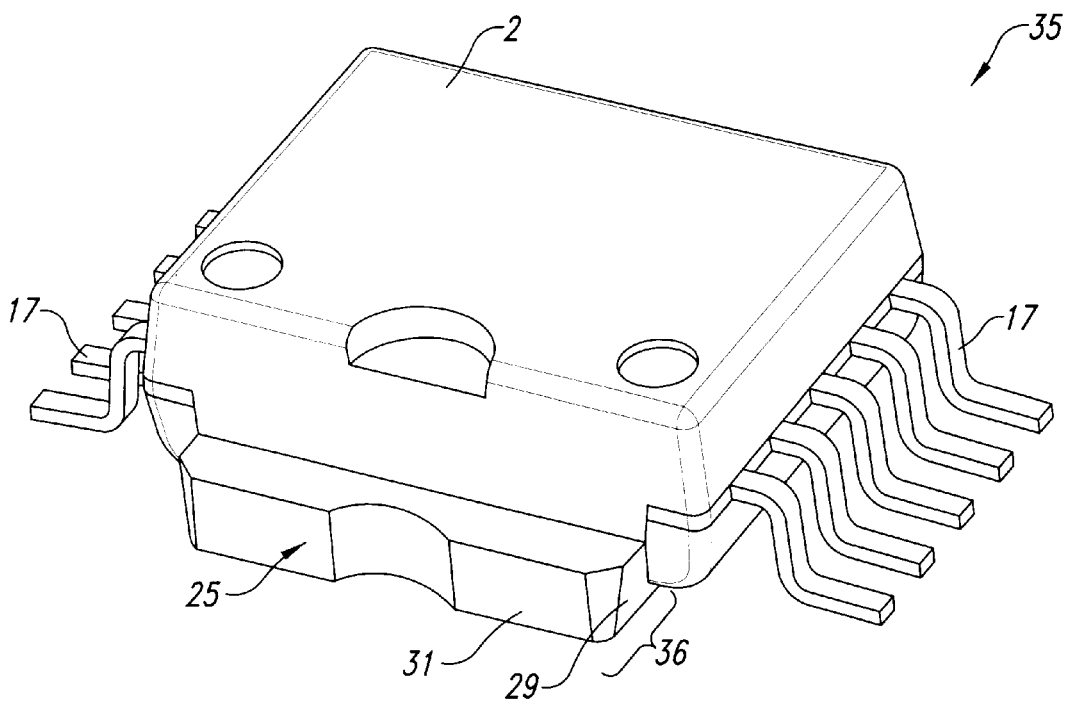
FIG. 11 is a perspective view of a plastic package obtained in accordance with the illustrated embodiment of this invention.

FIG. 11 shows the package, overall indicated at 35, after its removal from the mold 33 and subsequent steps wherein the individual packages are separated from one another (the singulation step) by cutting the metal strip on which the series of lead frames are formed, and the leads are bent to form the pins 17.

The heat sink element 25 has, in the peripheral portions 36 outside the plastic case 2, as shown in FIG. 11, its side surfaces 29, parallel to the y direction, inclined from an orthogonal straight line to the major surfaces of the heat sink element with a negative outward slope. In this example, the portions of such surfaces inside the plastic case, not in view in FIG. 11, are instead orthogonal to the major surfaces of the heat sink element 25. In a typical embodiment, these central portions have a different, slightly smaller width than the outwardly extended portion.

It should be appreciated that while this invention has been particularly illustrated in connection with packages of the dual-in-line type, this invention may also be applied to packages having projecting pins from one side only of the plastic case, that is of the single-in-line type. In addition, the pins could project for equal effect either orthogonal or parallel to the direction in which the plastic case is extended outwardly, both in the dual-in-line version illustrated herein and the single-in-line version.

Even though a single embodiment of this invention has been illustrated and described herein, it should be understood that many variations and modifications are possible based on the same general inventive concept.

It should be considered that the through-going groove illustrated in the preferential embodiment could be non-straight and follow a different pattern, but always including corresponding to each heat sink element portions adapted to accommodate, for example, a single heat sink element. These portions may typically have a main axial direction parallel to the direction along which the heat sink element extends outwards from the plastic case. For example, the through-going groove may have the overall pattern of a polygonal line.

The number of the heat sink elements accommodated inside each through-going groove may vary to suit particular applications. In the extreme, each through-going groove could accommodate only one heat sink element.

While the preferential embodiment described advantageously provides for the use of a through-going groove to accommodate each heat sink element, this is no strict requirement for the purpose of this invention, and a blind hollow could be used instead, as shown in the previous scheme of the invention according to FIGS. 7 and 8.

The depth of the groove described by the figures is greater than the height of the heat sink element it is to receive, but its functionality would not change even if a particular applications required a groove of smaller or equal depth, with the heat sink element extending upwardly toward the upper portion of the mold main cavity.

The side surfaces 29 of the heat sink element 25 lying parallel to the y direction could be, in a different embodiment, inclined also at their central portion embedded within the plastic case, in a simplified, easily manufactured construction. In the extreme, the side surfaces 31 parallel to the x direction and completely outside the plastic case could also be inclined, and still fall within the scope of the present invention.

Furthermore, for the purpose of this invention, that the heat sink element should extend out of the case in a symmetrical way is no strict requirement, nor is that it should be symmetrical. The heat sink element may have different shapes and dimensions also in the respect of the plastic case, and its width along x could be the same as that of the case, for example.

The figures described relate to the typical instance of the heat sink element being extended outside the plastic case from two opposite sides. In the alternative, the heat sink element could come out from one side only, so being anyway determined a y direction along which the walls of its housing would be inclined. Also, side surfaces of the heat sink element could jut out of the plastic case in a direction different than a direction orthogonal to the respective side of the case. Where the peripheral portions of the heat sink element outside the plastic case are made to extend from three or more sides, or in some more complex arrangement, the housing would no longer have a single main direction, but in accordance with this invention its walls would have to be inclined at least in each portion in contact with side surfaces, also correspondingly inclined, of the heat sink element, near and outside the plastic case.

Of course, changes and modifications may be made unto the method described and illustrated hereinabove without departing from the invention scope as defined in the following claims.

We claim:

1. A method for forming a plastic package for a power semiconductor electronic device to be encapsulated within a plastic case and to be coupled thermally to a heat sink element having a major surface exposed and at least one peripheral portion protruding outwards from at least one side of the plastic case, the method comprising:

forming the plastic case of the package by molding inside a main cavity of a mold after positioning said heat sink element with said major surface in contact with a bottom of a suitable housing provided in a lower portion of said mold which opens into said main cavity of the mold;

forming said heat sink element such that at least side surfaces jutting out of said side of the plastic case are, at least in a zone adjacent to said side and in said peripheral portion, inclined to form an angle α substantially greater than zero with a normal line to said major surface, so as to have a negative slope from outside;

forming said housing is correspondingly such that its inner walls facing said side surfaces of the heat sink element are inclined, at least in said zone, to form an angle substantially equal to said angle α with said normal line, with a positive slope from the housing interior; and providing thrust means which, when the mold is closed, is engaged from above with at least part of said peripheral portion of the heat sink element to exert thereon a compressive force having its direction substantially toward the housing bottom and which is effective to hermetically seal temporarily in said zone adjacent to said side of the plastic case between said side surfaces of the heat sink element and said inner walls of the housing.

2. A method according to claim 1 wherein said angle α is greater than 1° and smaller than 30°.

3. A method according to claim 1 wherein said housing for the heat sink element is in the form of a through-going groove having at least one portion adapted to accommodate at least one heat sink element on its bottom.

4. A method according to claim 3 wherein said heat sink element is placed in said portion of the groove at a enlargement of said groove portion forming said main cavity in the lower portion of the mold and such that said peripheral portion locates along the groove and outside the enlargement.

5. A method according to claim 3 wherein said portion of the groove has a main axial direction, said inner walls of the housing form sidewalls of said groove portion and are substantially parallel to said main axial direction, and likewise said side surfaces of the heat sink element extending out from said side of the plastic case are disposed in the groove substantially parallel to said main axial direction.

6. A method according to claim 5 wherein for the molding a plurality of heat sink elements are introduced, spaced apart along a common main axial direction, into said through-going groove for simultaneously forming a corresponding plurality of plastic cases.

7. A method according to claim 3 wherein said thrust means is in the form of elements jutting out of an upper portion of the mold, adjacent to said main mold cavity, and can be inserted into said groove having cross dimensions substantially equal to those of the groove.

8. A mold for forming a plastic case for protecting a semiconductor electronic device fully encapsulated within the plastic case and thermally coupled to a heat sink element having a major surface exposed and at least one peripheral portion protruded outside the plastic case from at least one side thereof, the mold comprising:

a main cavity for forming the plastic case by molding, and in a lower portion, a housing structured for positioning the heat sink element onto a bottom surface which opens into said main mold cavity, wherein in a portion structured to receive said peripheral portion of the heat sink element, inner walls of said housing are, at least in a zone adjacent to said main mold cavity, inclined to form an angle substantially greater than zero with a normal line to said bottom surface of the housing, with a positive slope from the housing interior; and thrust means extends from above toward said portion of said housing, being adapted to engage with at least said peripheral portion of the heat sink element.

9. A mold according to claim 8 wherein said angle is smaller than 30°.

10. A mold according to claim 8 wherein said housing for the heat sink element is in the form of a through-going groove including at least one portion adapted to accommodate at least one heat sink element on its bottom.

11. A mold according to claim 10 wherein said groove portion has a enlargement therein which forms said main cavity in the lower portion of the mold.

12. A mold according to claim 11 wherein the edge of said groove portion is at the same level as an edge of said main cavity in the lower portion of the mold.

13. A mold according to claim 10 wherein said groove portion has a main axial direction and said inner walls of the housing form sidewalls of said groove portion and are substantially parallel to said main axial direction.

14. A mold according to claim 13 wherein said through-going groove has a single main axis and comprises a plurality of said spaced-apart portions.

15. A mold according to claim 13 wherein said inner sidewalls of said groove are inclined along the entire length of the groove.

16. A mold according to claim 10 wherein said thrust means include elements jutting out of an upper portion of the groove, adjacent to said main mold cavity, and can be inserted into said groove having cross dimensions substantially equal to those of the groove.

17. A package for a power semiconductor electronic device, the package comprising:

a plastic case formed by molding and having at least one die of a semiconductor electronic circuit encapsulated therein; and a heat sink element coupled thermally to the semiconductor electronic circuit, having a major surface exposed, and at least one peripheral portion extended out of the plastic case from at least one side thereof, wherein at least side surfaces of said heat sink element, extending out from said side of the plastic case, form, at least in a zone adjacent to the case and in said peripheral portion, an angle substantially greater than zero with the direction of a normal line to said major surface of the heat sink element having a negative slope from outside.

18. A package according to claim 17 wherein said angle is smaller than 30°.

19. A package according to claim 17 wherein the portions of the side surfaces of the heat sink element which lie inside the plastic case form a substantially zero angle with said normal line.

20. A package according to claim 17 wherein the at least one peripheral portion includes first and second peripheral portions extending outward from opposite sides of the plastic case.

21. A mold for forming a plastic case for protecting a semiconductor electronic device fully encapsulated within the plastic case and thermally coupled to a heat sink element having a major surface exposed and at least one peripheral portion protruded outside the plastic case from at least one side thereof, the mold comprising:

a lower portion structured for securely positioning the heat sink element, the lower portion including a guide portion structured to receive the peripheral portion of the heat sink element, the guide portion including a bottom surface and inner walls that are inclined outwardly from the bottom surface to form an angle substantially greater than zero with a normal line to the bottom surface; and an upper portion that, with the lower portion forms a main cavity for forming the plastic case, the upper portion including a protrusion that extends toward the guide portion of said housing, the protrusion being structured to engage the peripheral portion of the heat sink element to hold the heat sink element securely against the inner walls of the guide portion.

22. The mold of claim 21 wherein the lower portion includes a main portion in communication with the guide portion, the main portion including a bottom surface that is coplanar with the bottom surface of the guide portion.

23. The mold of claim 21 wherein the lower portion includes a main portion in communication with the guide portion, the guide portion having a width substantially equal to a width of the heat sink element and the main portion having a width greater than the widths of the heat sink element and the guide portion such that the main portion includes a peripheral portion extending outwardly from the heat sink element.

* * * * *